(12) United States Patent
Tsubaki et al.

(10) Patent No.: US 9,117,853 B2
(45) Date of Patent: Aug. 25, 2015

(54) TRANSFER SYSTEM

(76) Inventors: Tatsuo Tsubaki, Ise (JP); Yusuke Fujiwara, Ise (JP)

( * ) Notice: Subject to any disclaimer, the term of this patent is extended or adjusted under 35 U.S.C. 154(b) by 219 days.

(21) Appl. No.: 13/876,471

(22) PCT Filed: Aug. 29, 2011

(86) PCT No.: PCT/JP2011/069434
§ 371 (c)(1),
(2), (4) Date: Mar. 27, 2013

(87) PCT Pub. No.: WO2012/043110
PCT Pub. Date: Apr. 5, 2012

(65) Prior Publication Data
US 2013/0197691 A1    Aug. 1, 2013

(30) Foreign Application Priority Data
Sep. 30, 2010   (JP) ................................ 2010-221953

(51) Int. Cl.
*G06F 7/00*    (2006.01)
*H01L 21/67*   (2006.01)
*H01L 21/677*  (2006.01)
*H01L 21/687*  (2006.01)

(52) U.S. Cl.
CPC ............ *H01L 21/67* (2013.01); *H01L 21/6773* (2013.01); *H01L 21/67259* (2013.01); *H01L 21/67733* (2013.01); *H01L 21/67736* (2013.01); *H01L 21/68707* (2013.01)

(58) Field of Classification Search
None
See application file for complete search history.

(56) References Cited

U.S. PATENT DOCUMENTS

2006/0051188 A1   3/2006   Hoshino
2007/0163461 A1   7/2007   Shiwaku

FOREIGN PATENT DOCUMENTS

| JP | 2003-192269 A |   | 7/2003 |
|----|---------------|---|--------|
| JP | 2003192269 A  | * | 7/2003 |
| JP | 2007-191235 A |   | 8/2007 |
| JP | 2010-208816 A |   | 9/2010 |
| JP | 2010208816 A  | * | 9/2010 |

OTHER PUBLICATIONS

Translation of International Preliminary Report on Patentability issued Apr. 9, 2013, for corresponding International PCT Application No. PCT/JP2011/069434.

(Continued)

*Primary Examiner* — Yolanda Cumbess (57) ABSTRACT

For transferring an article to a desired position, even in a lateral transfer, a transfer system (100) allows transfer of an article (3) between a transport vehicle (2), which conveys the article (3) while travelling along a rail (1) provided on a ceiling, and a placement portion provided below the rail, in a lateral transfer manner. The transfer system includes a memory unit (101) and a controller (102). The memory unit stores (i) placement position information indicating a transfer position of the article when a transfer unit is to place the article onto the placement portion, and (ii) holding position information indicating a transfer position of the article when the transfer unit is to hold the article on the placement portion. The controller controls the transfer unit such that, when the transfer unit is to place the article, the article is transferred at a transfer position indicated in the placement position information and, when the transfer unit is to hold the article, the article is transferred to a transfer position indicated in the holding position information.

17 Claims, 9 Drawing Sheets

(56) References Cited

OTHER PUBLICATIONS

International Search Report form PCT/ISA/210 (second sheet), dated Nov. 7, 2011 from PCT/JP2011/069434.

Extended European Search Report (EESR) dated Feb. 11, 2015; Application No. 11828671.5.

* cited by examiner

| | Placement Portion | Common Coordinate |
|---|---|---|
| Common Data | Port of the Manufacturing Equipment: A | $(X_{1A}, Y_{1A}, Z_{1A}, \Theta_{1A})$ |
| | Port of the Manufacturing Equipment: B | $(X_{1B}, Y_{1B}, Z_{1B}, \Theta_{1B})$ |
| | .... | .... |
| | UTB: A | $(X_{2A}, Y_{2A}, Z_{2A}, \Theta_{2A})$ |
| | UTB: B | $(X_{2B}, Y_{2B}, Z_{2B}, \Theta_{2B})$ |
| | .... | .... |
| | Right STB: A | $(X_{3A}, Y_{3A}, Z_{3A}, \Theta_{3A})$ |
| | Right STB: B | $(X_{3B}, Y_{3B}, Z_{3B}, \Theta_{3B})$ |
| | .... | .... |
| | Left STB: A | $(X_{4A}, Y_{4A}, Z_{4A}, \Theta_{4A})$ |
| | Left STB: B | $(X_{4B}, Y_{4B}, Z_{4B}, \Theta_{4B})$ |
| | .... | .... |

Fig. 6

| | Placement Portion | Presence of FOUP (Placing Action/ Holding Action) | Machine Difference Coordinate |
|---|---|---|---|
| Unique Data | Port of the Manufacturing Equipment | Absence | $(X_{111}, Y_{111}, Z_{111}, \Theta_{111})$ |
| | | Presence | $(X_{112}, Y_{112}, Z_{112}, \Theta_{112})$ |
| | UTB | Absence | $(X_{211}, Y_{211}, Z_{211}, \Theta_{211})$ |
| | | Presence | $(X_{212}, Y_{212}, Z_{212}, \Theta_{212})$ |
| | Right STB | Absence | $(X_{311}, Y_{311}, Z_{311}, \Theta_{311})$ |
| | | Presence | $(X_{312}, Y_{312}, Z_{312}, \Theta_{312})$ |
| | Left STB | Absence | $(X_{411}, Y_{411}, Z_{411}, \Theta_{411})$ |
| | | Presence | $(X_{412}, Y_{412}, Z_{412}, \Theta_{412})$ |

Fig. 7

| | Placement Portion | Holding Operation | Machine Difference Coordinate |
|---|---|---|---|
| | | Placing Operation | |
| Unique Data | Port of the Manufacturing Equipment | FOUP: Absence | $(X_{111}, Y_{111}, Z_{111}, \Theta_{111})$ |
| | | Offset Amount | $(\sigma_{X1}, \sigma_{Y1}, \sigma_{Z1}, \sigma_{\Theta1})$ |
| | UTB | FOUP: Absence | $(X_{211}, Y_{211}, Z_{211}, \Theta_{211})$ |
| | | Offset Amount | $(\sigma_{X2}, \sigma_{Y2}, \sigma_{Z2}, \sigma_{\Theta2})$ |
| | Right STB | FOUP: Absence | $(X_{311}, Y_{311}, Z_{311}, \Theta_{311})$ |
| | | Offset Amount | $(\sigma_{X3}, \sigma_{Y3}, \sigma_{Z3}, \sigma_{\Theta3})$ |
| | Left STB | FOUP: Absence | $(X_{411}, Y_{411}, Z_{411}, \Theta_{411})$ |
| | | Offset Amount | $(\sigma_{X4}, \sigma_{Y4}, \sigma_{Z4}, \sigma_{\Theta4})$ |

Fig. 8A

| | Placement Portion | Placing Operation | Machine Difference Coordinate |
|---|---|---|---|
| | | Holding Operation | |
| Unique Data | Port of the Manufacturing Equipment | FOUP: Presence | $(X_{112}, Y_{112}, Z_{112}, \Theta_{112})$ |
| | | Offset Amount | $(\sigma_{X1}, \sigma_{Y1}, \sigma_{Z1}, \sigma_{\Theta1})$ |
| | UTB | FOUP: Presence | $(X_{212}, Y_{212}, Z_{212}, \Theta_{212})$ |
| | | Offset Amount | $(\sigma_{X2}, \sigma_{Y2}, \sigma_{Z2}, \sigma_{\Theta2})$ |
| | Right STB | FOUP: Presence | $(X_{312}, Y_{312}, Z_{312}, \Theta_{312})$ |
| | | Offset Amount | $(\sigma_{X3}, \sigma_{Y3}, \sigma_{Z3}, \sigma_{\Theta3})$ |
| | Left STB | FOUP: Presence | $(X_{412}, Y_{412}, Z_{412}, \Theta_{412})$ |
| | | Offset Amount | $(\sigma_{X4}, \sigma_{Y4}, \sigma_{Z4}, \sigma_{\Theta4})$ |

TRANSFER SYSTEM

CROSS-REFERENCE

This application is a U.S. national phase application of International Application PCT/JP2011/069434, filed Aug. 29, 2011, published as WO/2012/043110, which claims the benefit of Japanese priority application No. JP2010-221953 filed on Sep. 30, 2010. Each of these applications is incorporated herein by reference in its entirety.

TECHNICAL FIELD

The present invention belongs to a technical field of a transfer system for transferring an article such as a FOUP (Front Opening Unified Pod), which is used to contain various substrates for semiconductor elements, between a vehicle such as a transport vehicle and a placement portion such as a port.

BACKGROUND SECTION OF THE INVENTION

For a transfer system, a hanging transport apparatus has been proposed (Japanese Unexamined Patent Publication No. 2003-192269 (hereinafter "the '269 publication"), for example). In this system, the amount of position adjustment for lifting up and the amount of position adjustment for lowering down are set at each of support tables. When a work (i.e., article) is moved up and down while being hanged, a workhand of the system adjusts the position of the work in a hanging state by lifting up or lowering down the work by the already set position adjustment amount.

According to the above-described system of the '269 publication, it is possible to perform what is called a vertical transfer, for transferring a work between a vehicle and a port provided directly below the traveling path for a traveling apparatus for transportation. However, the system cannot perform what is called a lateral transfer, for transferring a work between a vehicle and a port provided in a right and left lateral direction relative to a traveling apparatus for transportation (i.e., a traveling path). The reason is that even if a laterally moving table for position adjustment in the '269 publication is moved in any ways, it only adjusts offset in the right and left lateral direction of the laterally moving table that faces a port directly below the travelling path.

Here, according to results of a study or an experiment or experiences by the present inventors, assuming the lateral transfer is performed in the system of the '269 publication, if the laterally moving table for position adjustment (hereinafter, referred as "lateral moving table") moves to the right, for example, in the right and left lateral direction, the lateral moving table and the elevating unit and workhand provided under the table considerably protrudes in the right direction. Depending on the degree of protrusion, the lateral moving table is deflected due to the weight of the elevating unit and the workhand, so that the workhand and the work gripped by the workhand are inclined turning around the traveling path. Especially, when unloading the work (i.e., placing the work), due to the weight of the work, the deflection of the lateral moving table becomes more obvious, and the work is likely to incline considerably. The inclination of the work causes an offset in the transfer position of the work in a lateral transfer. Therefore, when performing the lateral transfer, there is a technical problem that the work cannot be transferred to a desired position, thereby failing a lateral transfer.

SUMMARY SECTION OF THE INVENTION

The present invention was conceived in view of the above-described problem. It is an object of the present invention to provide a transfer system that can transfer an article to a desired position in a lateral transfer as well.

In order to solve the above-described problem, a transfer system according to one aspect of the present invention includes a transport vehicle and a placement portion. The transport vehicle moves along a rail provided on a ceiling for moving an article. The placement portion is disposed below the rail, having a predetermined position on which the article can be placed. The transport vehicle has a transfer unit that can hold the article on the placement portion and place the article onto the placement portion. The transfer unit can transfer the article between the transport vehicle and the placement portion in a lateral transfer manner. The transfer system further includes a memory and a controller. The memory stores (i) placement position information indicating a transfer position of the article when the transfer unit is to place the article onto the placement portion, and (ii) holding position information indicating a transfer position of the article when the transfer unit is to hold the article on the placement portion. The controller controls the transfer unit such that, when the transfer unit is to place the article, the article is transferred at a transfer position indicated in the placement position information in the memory and, when the transfer unit is to hold the article, the article is transferred to a transfer position indicated in the holding position information in the memory.

The transport vehicle according to one aspect of the present invention is an OHT (Overhead Hoist Transfer) or the like for transporting FOUPs. The transport vehicle can transfer an article between itself and placement portions of load ports, which allow the article to be moved into and out of manufacturing equipment for manufacturing semiconductor elements and stockers, or of buffers or the like installed above the transport conveyor in a lateral transfer manner as well as in a vertical transfer manner. Here, "vertical transfer manner" means one in which the FOUP is transferred between the vehicle and a placement portion installed in the vertical direction of the transport vehicle main body. In contrast, "lateral transfer manner" means one in which the FOUP can move in a lateral direction perpendicular to the rail direction, so that the FOUP is transferred between the vehicle and a placement portion installed in a lateral direction of the transport vehicle main body. In other word, the transfer is performed by moving the FOUP in the lateral direction.

As described above, when the FOUP is moved in the lateral direction of the transport vehicle main body, due to the weight of the holding part for holding the FOUP and the moving portion for moving the holding part in the vertical direction or in the lateral direction, an offset occurs in the center of gravity of the transport vehicle main body. At this time, the travelling rollers of the transport vehicle that travel along the rail may deform or a part of the moving portion may be tilted, so that the transport vehicle main body is inclined turning in the rotation direction around the rail direction. This tilt of the transport vehicle main body results in the inclination of the holding part, so that the FOUP held by the holding part is also tilted. In this state, if the lateral transfer were performed at a transfer position for which the tilting situation is not taken into account, the FOUP would be placed onto the placement portion in a tilted state or be placed outside of the placement portion, so that the FOUP may be offset from the position set in advance on the placement portion (in other word, the predetermined position). If the FOUP is offset from the predetermined position, the manufacturing process for the semiconductor elements, a transport process or a part of the transport process included in the manufacturing process have to be stopped. On the other hand, if a position were determined in advance in order to avoid offset during the transfer operation (in other words, placing operation) (in other word, precisely speaking, before unloading the FOUP) due to the tilt of the FOUP (in other word, the weight), an offset would occur during the holding operation (in other word, precisely speaking, before the FOUP is held) in which the weight of the FOUP does not exist.

Therefore, in the transfer system according to one aspect of the present invention, when performing the lateral transfer, in either of the placing operation and the holding operation, the transport vehicle is controlled so that the FOUP is positively placed onto the predetermined position of the placement portion or that the FOUP on the predetermined position is positively held.

According to the transfer system according to one aspect of the present invention, the memory unit such as ROM and memory is installed in the transport vehicle, for example. The memory unit stores the information on the placement position corresponding to the placing operation, and the information on the holding position corresponding to the holding operation. The controller such as a CPU is installed in the transport vehicle, similar to the memory unit, for example. The controller reads out, from the memory unit, a position information (in other word, the placing position information or the holding position information) corresponding to an operation to be performed (in other words, the placing operation or the holding operation), and controls the transport vehicle such that the operation is performed at the transfer position indicated in the read out position information.

As described above, when the placing operation is performed, it is performed at the transfer position indicated in the placement position information, and when the holding operation is performed, it is performed at the transfer position indicated in the holding position information. In other words, in order to overcome offset of the article which can happen in the placing operation, the transfer position for the placing operation is set to be different from that for the holding operation. Accordingly, regardless of the amount of the tilt of the moving portion and the like due to the weight of the article, it is possible to perform the lateral transfer in which the article is placed onto a desired position as a predetermined position on the placement portion.

It should be noticed that the above-described functions and effects (in other words, always placing the article on a desired position by differentiating the transfer positions between the placing operation and the holding operation) can be effectively applied to both the transfer in a vertical transfer manner as well as the transfer in a lateral transfer manner. The reason is that the conditions of the rail, the traveling rollers, a pair of belts of the transport vehicle for hanging the holding unit, and the article to be placed or held (for example, deformation of the rail, inclination of the traveling rollers, difference in the length of the belts, offset in the center of gravity of the FOUP) may result in offset in the transfer positions between the placing operation and the holding operation even in the vertical transfer.

Alternatively, the memory unit and the controller can be provided in a main controller that controls the overall transfer system, instead of in the transport vehicle. In this case, the main controller comprises, for example, a database and a transport vehicle controller. The database is a memory means for storing identification number of the transport vehicles and position information unique to the transport vehicles, while associating them with each other. The transport vehicle controller is a controlling means for controlling a transport vehicle based on position information corresponding to the placing operation or the holding operation, which is read out from the database.

It should be noticed that the transfer system can include a plurality of transport vehicles and a plurality of placement portions.

According to one aspect of the transfer system according to the present invention, the placement position information and the holding position information are each indicated as sum of a common data indicating a transfer position common among a plurality of transport vehicles and a unique data indicating a transfer position unique to each transport vehicle.

Here, the "common data" related to the placement position information and holding position information represents data that is common among a plurality of transport vehicles at a plurality of placement portions. The common data in the placement position information and the one in the holding position information are the same, for example. Moreover, "unique data" or machine difference data represents data unique to the transport vehicle at a plurality of placement portions. The unique data in the placement position information and in the holding position information are different from each other, for example. According to this embodiment, the placement position information and the holding position information are configured by two data including the common data and the unique data. Therefore, if the common data is mainly managed and is updated periodically, for example, it is possible to always keep the highly precise data related to the transfer position in the memory means. Especially, it is also possible to considerably shorten the acquisition time of the common data common among the plurality of transport vehicles. Considering that a lot of transport vehicles and a lot of transfer positions may exist in the transfer system, the shortening of the data acquisition time makes it possible to shorten the transfer time, which is very beneficial in practice.

In this embodiment, the difference between the unique data of the placement position information and the unique data of the holding position information may correspond to an offset or displacement amount of the article calculated based on inclination degree of the article and a height of the article at the transfer position.

Here, "inclination degree" related to the article represents inclination angle of the article at the transfer position, relative to the placement portion. Moreover, "offset amount" of the article is explained as follows. When the placing operation and holding operation in the vertical transfer and the holding operation in the lateral transfer are performed, the position of the article in a horizontal state at the transfer position is set as zero point. In this case, "offset amount" represents a distance from the zero point to the article in a tilted state at the transfer position when the placing operation is performed in a lateral transfer. The offset amount σ can be uniquely calculated, with the following formula (1) for example, based on the inclination degree Φ and the height of the article "h". If the offset amount σ is determined, the offset amount information indicating the offset amount σ, for example, is added to the holding position information in the unique data, in order to determine the placing position information in the unique data.

$$\sigma = h \times \sin \Phi \qquad (1)$$

This configuration makes it possible to configure the unique data from the two data including the holding position information and the offset amount information, thereby minimizing the data capacity of the memory means.

According to another aspect of the transfer system of the present invention, the transfer unit includes a holding unit configured to hold and release the article, a vertical moving unit configured to move the holding unit in a vertical direction, a lateral moving unit configured to move the holding unit in a lateral direction perpendicular to the rail, and a rotation moving unit configured to rotate the holding unit around a vertical axis. Each of the placement position information and the holding position information indicates positions in four directions including the direction of the rail, the lateral direction, the vertical direction, and the direction of the rotation around the vertical direction.

According to this embodiment, the transfer unit can move the holding unit such as a gripper for holding the article in three directions including a vertical direction, a lateral direction and a direction of the rotation around the vertical axis. The placement position information and the holding position information each indicate the positions in four directions including a direction of the rail in addition to the three directions. Regarding the positions in the four directions, as a coordinate for example, the holding position information may be indicated as $(X^{}_1, Y^{}_1, Z^{}_1, \Theta^{}_1)$, and the placement position information may be indicated as $(X^{}_2, Y^{}_2, Z^{}_2, \Theta^{}_2)$. Accordingly, it is possible to construct the data of the placement position information and the holding position information highly precisely.

It should be noticed that in a case that the positions in the four directions are indicated as the above-described coordinates, if the offset amount information is $(\sigma_X, \sigma_Y, \sigma_Z, \sigma_\Theta)$, the relationship between the placement position information and the holding position information may be expressed in the following formula (2).

$$(X^{}_2, Y^{}_2, Z^{}_2, \Theta^{}_2) = (X^{}_1, Y^{}_1, Z^{}_1, \Theta^{}_1) + (\sigma_X, \sigma_Y, \sigma_Z, \sigma_\Theta) \quad (2)$$

According to another aspect of the transfer system of the present invention, the article has a bottom surface formed with a concave portion, and the placement portion has a top surface formed with a convex portion with which the concave portion can be engaged, so that when performing the placing operation, the engagement between the concave portion and the convex portion allows the article to be placed on the predetermined position where the article is positioned relative to the placement portion.

Here, the "concave portion" of the article may be a recess called V-groove, for example, formed in an inverted V shape on the bottom surface of the article, and the "convex portion" of the placement portion may be a projection called kinematic pins, for example, formed on the top surface of the placement portion so as to be engaged with the concave portion of the article. If the concave portion and the convex portion are engaged with each other, the article is in a positioned state in which the article is positioned relative to the placement portion. The "predetermined position" of the placement portion indicates a position where the article is in a positioned state.

The transfer system, in which the placement position information and the holding position information are each indicated as the sum of the common data and the unique data, may further comprise a teaching unit configured to teach the common data among a plurality of transport vehicles.

The teaching unit includes at least a communication means using wireless or infrared ray. The teaching unit may be installed in the transport vehicle, similar to the memory and the controller. The teaching unit distributes common data stored in the memory to the other transport vehicles in order to teach the common data. This configuration makes it easier for one transport vehicle to teach the common data to a plurality of transport vehicles, so that all of the transport vehicles in a teaching area, i.e. an area where communication is possible, can hold the latest common data. As a result, it is possible to obtain the placement position information and the holding position information within a short time, in order to determine the transfer position, thereby shortening the transfer time.

Functions and other advantages of the present invention will be apparent from the following embodiments.

DETAILED DESCRIPTION OF THE INVENTION

Hereinafter, a preferred embodiment according to the present invention will be explained with reference to the figures.

Figure 1:
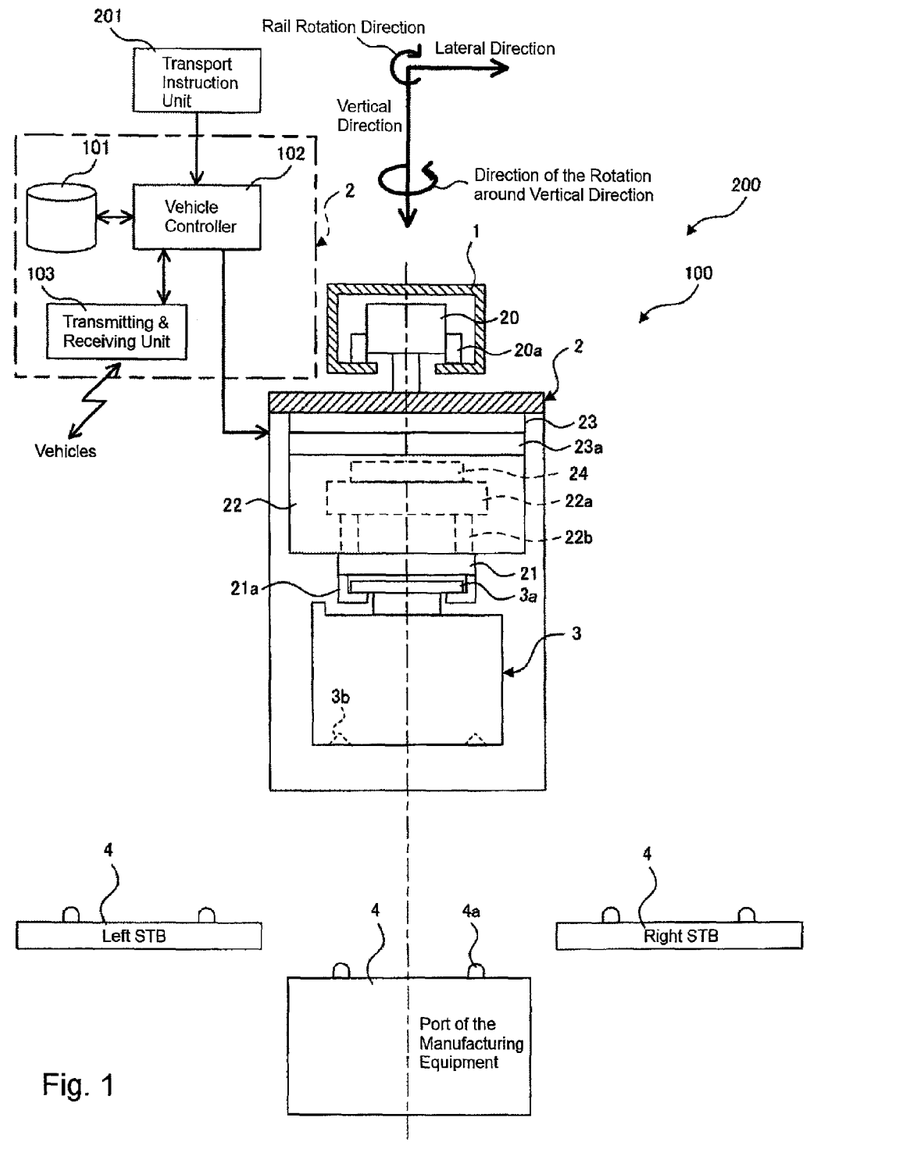
FIG. 1 is a front view schematically showing the configuration of the transfer system and the structure of the transport vehicle in the transfer system according to the embodiment of the present invention.

First, referring to FIG. 1, configuration of a transfer system 100 according to an embodiment of the present invention will be explained. FIG. 1 is a front view schematically showing the configuration of the transfer system 100 and the structure of vehicle 2 in the transfer system 100.

In FIG. 1, the transfer system 100 is included in a transport system 200 for transporting FOUP 3 containing substrates for manufacturing the semiconductor elements. The transfer system 100 is configured to transfer the FOUP 3 between the vehicle 2 and placement portions 4 based on instruction signals from a transport instruction unit 201 in the transport system 200. The transfer system 100 mainly includes a rail 1, the vehicle 2, and the placement portions 4.

The FOUP 3 is one example of "article" according to the present invention, and has a flange 3a as a handle for the vehicle 2 to grip the FOUP 3. The FOUP 3 has an under surface formed with a V-groove 3b (i.e., one example of "concave portion" according to the present invention), which can be engaged with kinematic pins 4a of the placement portion 4. The V-groove 3b is used for positioning the main body of the FOUP 3 with respect to the placement portion 4.

The placement portion 4 may be realized in various forms below the rail 1, such as a port of the manufacturing equipment, a UTB (Under Track Buffer), and right and left STBs (Side Table Buffer). Each of the placement portions 4 includes kinematic pins 4a (i.e., one example of "convex portion" according to the present invention) on its upper surface which can be engaged with the V-groove 3b of the FOUP 3. The kinematic pins 4a are used to position the FOUP 3 with respect to the placement portion 4.

The rail 1 is one example of "rail" according to the present invention, and may be installed on a ceiling inside a building of a manufacturing plant for the semiconductor elements in which the transport system 200 is installed. Inside of the rail 1 constitutes a part of the traveling path of the vehicle 2. An under surface of the rail 1 has a central portion that is opened so as to give way to a part that connects a traveling section 20 of the vehicle 2 and the main body of the vehicle 2.

The vehicle 2 is one example of "transport vehicle" according to the present invention, and comprises a main body and a controller. The main body includes the traveling section 20, a gripper 21, an elevating mechanism 22, a lateral mechanism 23 and a rotation mechanism 24. The controller includes a memory 101, a vehicle controller 102, and a transmitting and receiving unit 103. The traveling section 20 includes a motor (not shown), as a power source, and a pair of rollers 20a. The pair of rollers 20a is driven with the power of the motor, such that the main body is moved by the traveling section 20 along the rail 1.

The gripper 21 is one example of "holding part" according to the present invention, and includes a motor (not shown) as a power source and a pair of fingers 21a. The gripper 21 shifts the pair of fingers 21a between a holding sate in which the FOUP 3 is gripped and a releasing state in which the FOUP 3 is released, by driving the pair of fingers 21a with the power of the motor.

The elevating mechanism 22 is one example of "vertically moving portion" according to the present invention, and includes a motor (not shown) as a power source, a winding portion 22a, and a belt 22b. The elevating mechanism 22 winds or unwinds the belt 22b, whose one end is fixed to the upper surface of the gripper 21, by rotating the winding portion 22a in a winding direction or an unwinding direction with the power of the motor. Accordingly, the elevating mechanism 22 moves the gripper 21 in the vertical direction.

The lateral mechanism 23 is one example of "laterally horizontal moving portion" according to the present invention, and includes a motor (not shown) as a driving source and a slide portion 23a. The lateral mechanism 23 moves the elevating mechanism 22, which is fixed to a lower surface of the slide portion 23a, in a lateral direction by sliding the slide portion 23a in a lateral direction perpendicular to the rail 1 (i.e., the right and left direction in FIG. 1) with the power of the motor.

The rotation mechanism 24 is one example of "rotating moving portion" according to the present invention. The rotation mechanism 24 is included in the elevating mechanism 22, and includes a motor (not shown) as a driving source. The rotation mechanism 24 rotates the gripper 21 about the vertical axis via the winding portion 22a and the belt 22b, by rotating the winding portion 22a fixed to the under surface of the main body of the rotation mechanism 24 about the vertical axis with the power of the motor.

Figure 2:
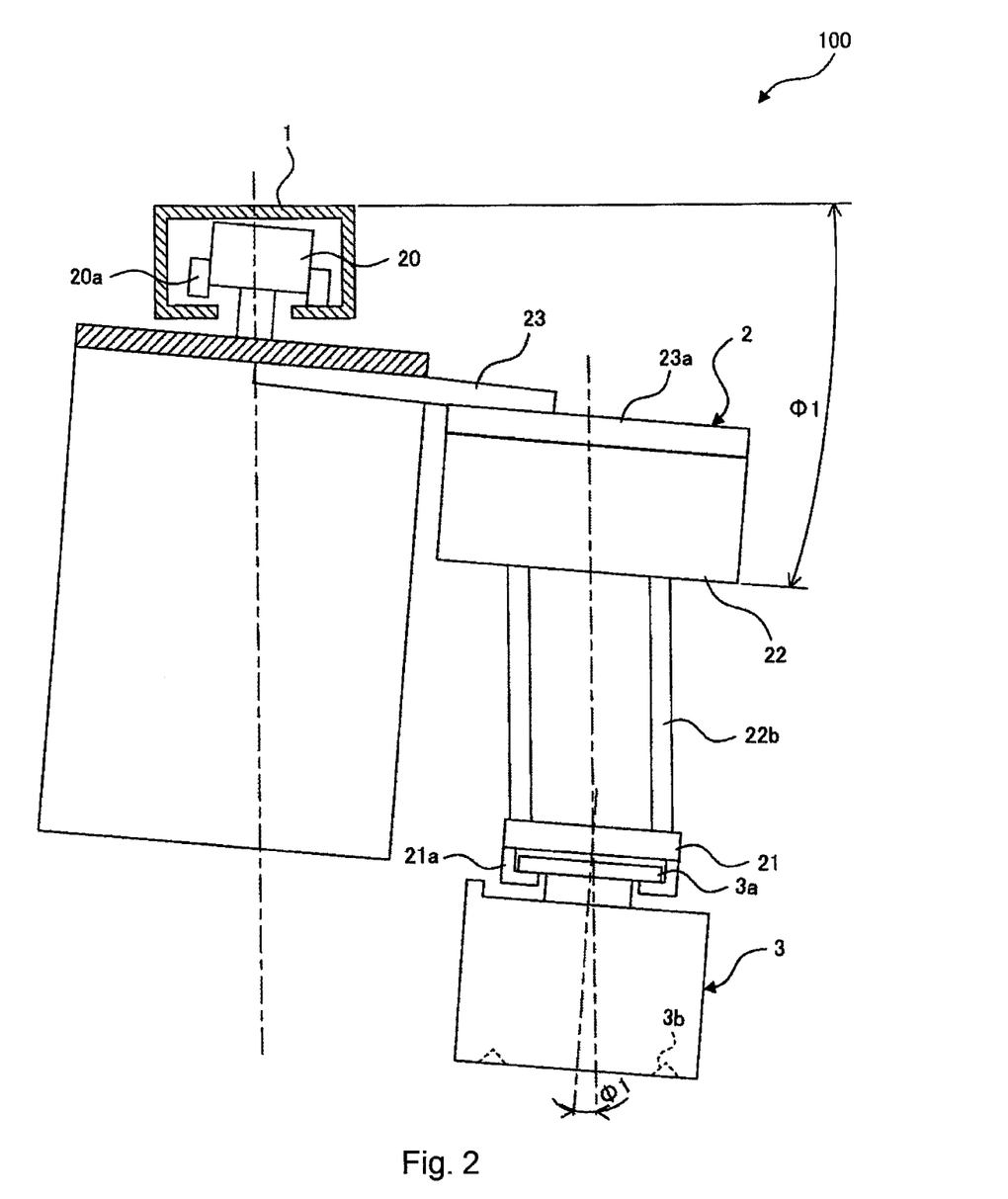
FIG. 2 is a front view for explaining a state of the transport vehicle in FIG. 1, when performing a transfer in a lateral transfer manner according to the embodiment.

Here, before explaining the memory 101, the vehicle controller 102 and the transmitting and receiving unit 103, the lateral transfer in the transfer system 100 will be explained with reference to FIG. 2. FIG. 2 is a front view for explaining a state of the vehicle 2 performing a lateral transfer.

In the transfer system 100, between the vehicle 2 and the placement portion 4, the FOUP 3 is transferred in the lateral direction as well as in the vertical direction. In FIG. 2, the vehicle 2 slides the slide portion 23a and moves the elevating mechanism 22 in a lateral direction, when performing the lateral transfer. At this time, due to the weight of the elevating mechanism 22 that has been moved in the lateral direction, one of the pair of the traveling rollers 20a far from the elevating mechanism 22 is lifted up, and the other near the elevating mechanism 22 is pressed towards the elevating mechanism 22 and deformed. In addition, the weight of the elevating mechanism 22 tilts the lateral mechanism 23, so that the main body of the vehicle 2 is inclined. The inclination direction is one that rotates about the rail 1 as a center axis. Accordingly, if the elevating mechanism 22 is inclined by $\Phi_1$ degree, the gripper 21 connected to the elevating mechanism 22 via the belt 22b, and the FOUP 3 gripped by the gripper 21, are inclined by $\Phi_1$ degree as well. It should be noticed that the inclination may be different to large degree when deciding the position of the gripper 21 or the FOUP 3 depending on whether the vehicle 2 is vacant (i.e., it is moving to load the FOUP 3) or the vehicle 2 has held the FOUP 3 (i.e., it is moving to unload the FOUP 3), i.e., depending on the weight of the FOUP 3.

The memory 101 is one example of "memory" according to the present invention, and stores data indicating the transfer position, as a position where the gripper 21 should exist, when the FOUP 3 is transferred between the vehicle 2 and the placement portion 4. It should be noticed that the data in a placing operation, when the lateral transfer is performed from the vehicle 2 to the placement portion 4, and the data in a holding operation, when the lateral transfer is performed from the placement portion 4 to the vehicle 2, are different from each other.

Figure 3:
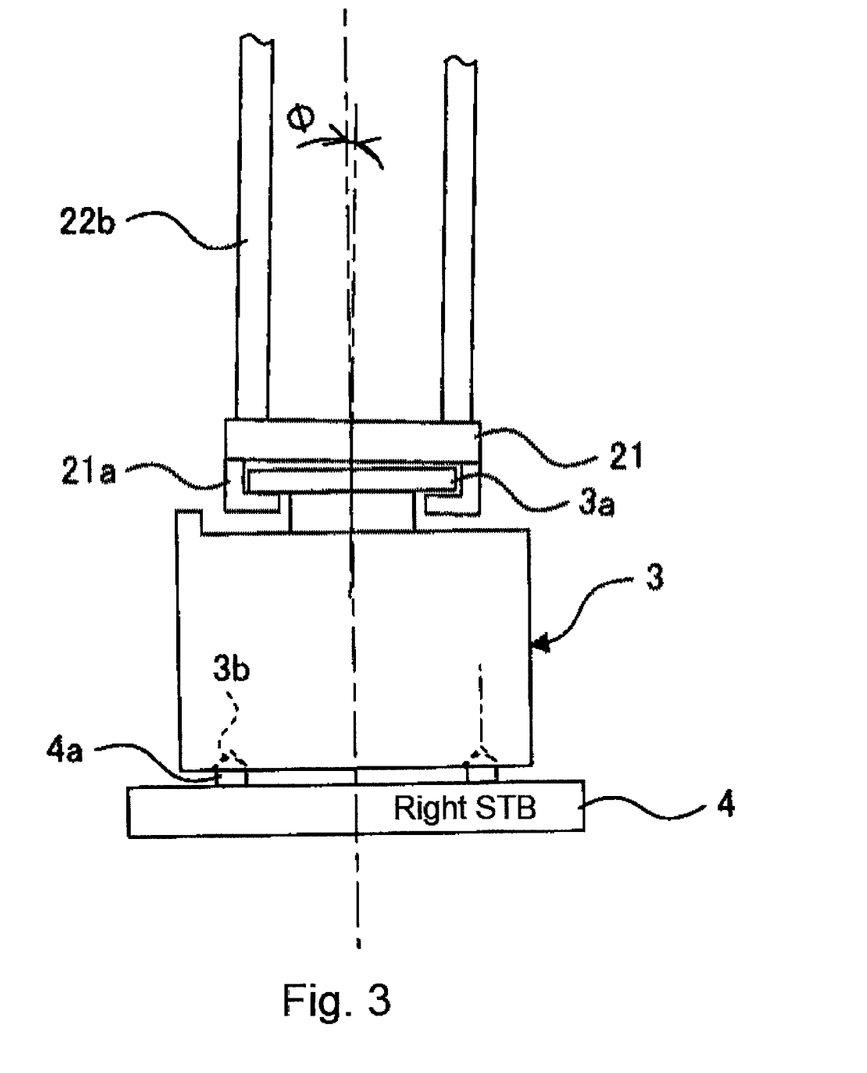
FIG. 3 is a front view showing a transfer position of the article gripped by the transport vehicle in FIG. 1 at the holding operation according to the embodiment.
Figure 4:
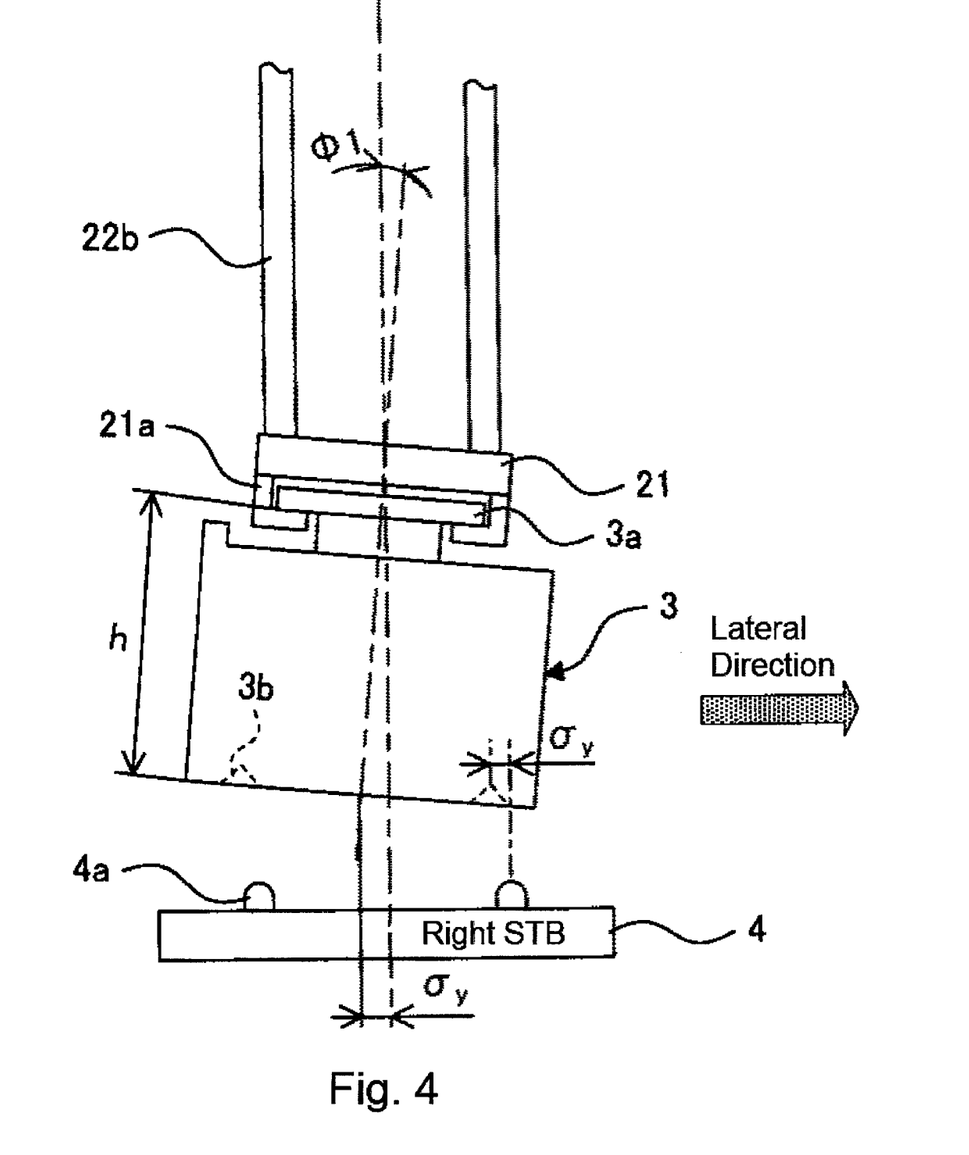
FIG. 4 is a front view for explaining about a transfer position of the article gripped by the transport vehicle in FIG. 1 at the placing operation according to the embodiment.

Here, with reference to FIG. 3 and FIG. 4, the holding operation and the placing operation will be explained. FIG. 3 is a front view explaining the transfer position in the holding operation. FIG. 4 is a front view explaining the transfer position in the placing operation.

FIG. 3 shows a placement portion 4 that serves as a right STB, a FOUP 3 positioned on the placement portion 4 (i.e., one example of "predetermined position" according to the present invention, and is referred to "positioning location" when appropriate), and a gripper 21 for holding the FOUP 3. The FOUP 3 at the positioning location is typically placed on the placement portion 4 horizontally. In addition, FIG. 3 shows an inclination angle (i.e., one example of "inclination degree" according to the present invention) $\Phi$ of the gripper 21 relative to the FOUP 3 (in other word, relative to the placement portion 4). According to the present embodiment, in the transfer position where the center of the gripper 21 and the center of the flange 3a of the FOUP 3 are aligned vertically, the vehicle 2 performs a holding operation for holding the FOUP 3. In other words, it is possible to perform the holding operation without moving in the lateral direction the gripper 21 which is not holding the FOUP 3.

FIG. 4 shows a placement portion 4 that serves as a right STB, and a FOUP 3 to be transferred to the placement portion 4, and a gripper 21 holding the FOUP 3. It should be noticed that FIG. 4 shows an inclination angle $\Phi_1$ of the FOUP 3 (in other words, of the gripper 21) relative to the placement portion 4, and height "h" of the FOUP 3. According to the present embodiment, an offset amount $\sigma_Y$ is calculated based on the inclination angle $\Phi_1$ and the FOUP height "h". A position of the FOUP 3, after having moved by such offset amount in a lateral direction (in other words, a direction indicated by the arrow in FIG. 4), is treated as the transfer position, and the vehicle 2 performs a placing operation for placing the FOUP 3 onto the positioning location of the placement portion 4.

Hypothetically, if the placing operation were performed at a transfer position at which the FOUP 3 has not been moved by the offset amount $\sigma_Y$ in the lateral direction (i.e., a state shown in FIG. 4), the end portion of the V groove 3b of the FOUP 3 would face the central portion of the kinematic pin 4a of the placement portion 4 in the vertical direction, so that the FOUP 3 would deviate from the positioning location of the placement portion 4 when being placed.

Therefore, as indicated in the below formula (3), in order to place the FOUP 3 to the positioning location in which the central portion of the kinematic pins 4a and the central portion of the V-groove 3b correspond to each other in the vertical direction, the offset amount $\sigma_Y$ of the FOUP 3 in the lateral direction is calculated. For example, if the FOUP height "h" is 330 mm and the inclination angle $\Phi_1$ is 0.5 degree, $\sigma_Y$ will be 2.9 mm.

$$\sigma_Y = h \times \sin \Phi_1 \qquad (3)$$

According to the present embodiment, when performing the holding operation, it is not necessary to change the transfer position as long as the center of the gripper 21 and the center of the flange 3a are aligned vertically. In contrast, when performing the placing operation, the transfer position is shifted by the offset amount $\Phi_Y$ calculated based on the inclination angle $\Phi_1$ and the height "h" of the FOUP 3 (in other words, of the gripper 21). In other words, the transfer position in the holding operation and the transfer position in the placing operation are different in the lateral direction by the offset amount $\sigma_Y$.

The vehicle controller 102 connected to the memory 101 is one example of "controller" according to the present invention. The vehicle controller 102 reads out data corresponding to the holding operation or the placing operation to be performed from the memory 101, and then performs the holding operation or placing operation to be performed at the transfer position indicated by the read out data.

The transmitting and receiving unit 103 connected to the memory 101 and the vehicle controller 102 is one example of "teaching unit" according to the present invention. The unit 103 transmits renewed data to another vehicle 2 when the data stored in the memory 101 is renewed. On the other had, the unit 103 receives renewed data sent from another vehicle 2. In this case, the vehicle controller 102 stores the received renewed data into the memory 101.

Figure 5:
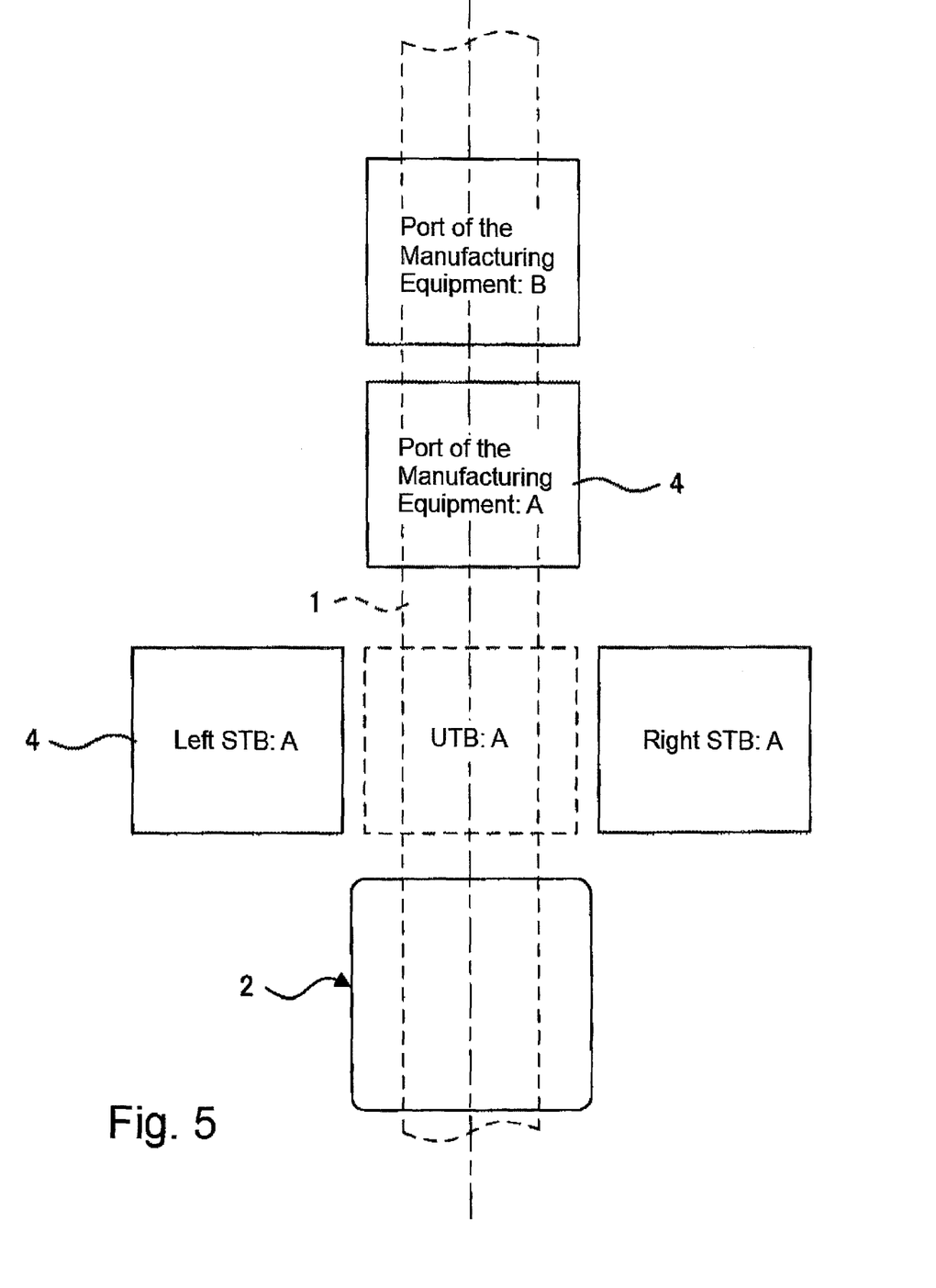
FIG. 5 is a top view schematically indicating installation of the various placement portions according to the embodiment.
Figure 6:
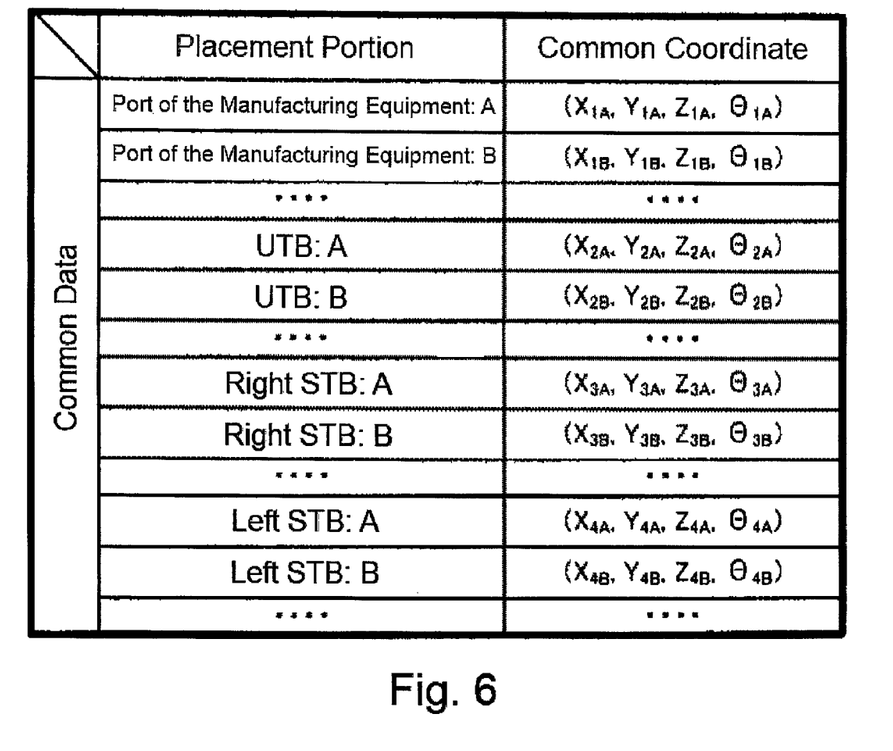
FIG. 6 is a table for reading out the common data according to the embodiment.
Figure 7:
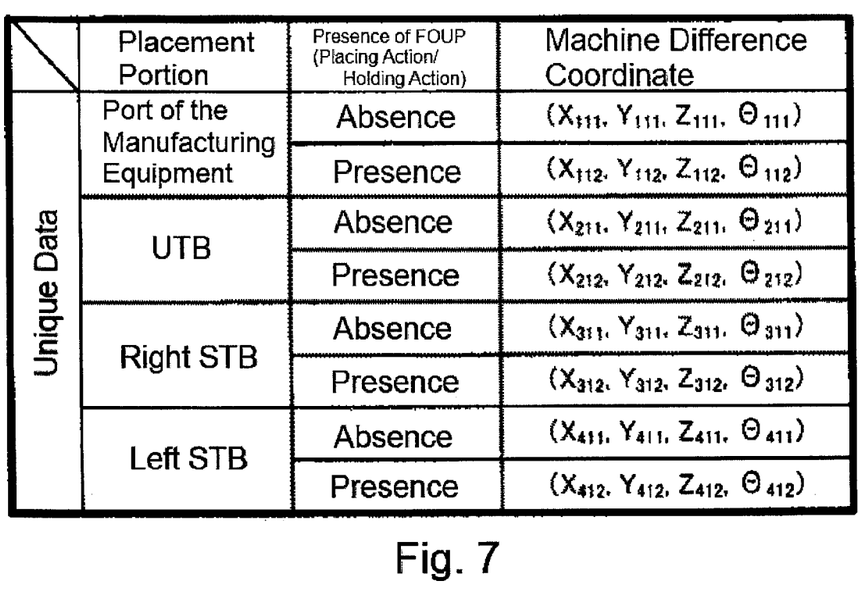
FIG. 7 is a table for reading out the unique data according to the embodiment.

Next, the data indicating the transfer position will be explained with reference to FIG. 5 to FIG. 7. FIG. 5 is a top view for explaining the various placement portions 4 installed in the transfer system. FIG. 6 and FIG. 7 are tables for explaining bout the structure of data store in the memory 100.

FIG. 5 shows ports A and B of a manufacturing equipment provided under the rail 1 in the vertical direction, and a UTB A, a left STB A provided below the rail 1 and to the left of the rail 1 in the lateral direction, and a right STB A provided below the rail 1 and to the right of the rail 1 in the lateral direction. According to the present embodiment, the transfer positions at the holding operation and the placing operation are indicated as a sum of a coordinate indicating the common data common among all of the vehicles 2 and a coordinate indicating the unique data unique to the vehicle 2.

FIG. 6 shows the common data. The common data indicates a data in which the placement portions 4 and common coordinates corresponding to the placement portions 4 are related to each other. FIG. 7 shows the unique data. The unique data indicates a data in which the four placement portions 4, i.e. the port of the manufacturing equipment, the UTB, and the right and left STBs, the presence of FOUP 3 on the placement portions 4, and machine difference coordinate or unique coordinates when the FOUP 3 is and is not present, are related to each other. Here, the case where FOUP 3 is not present means a holding operation, in which the transfer is performed in a releasing state in which the gripper 21 does not grip the FOUP 3, and the case where the FOUP is present means a placing operation, in which the transfer is performed in a holding state in which the gripper 21 grips the FOUP 3.

In FIG. 6 and FIG. 7, the common coordinates and the machine difference coordinates are expressed as coordinates defined with four directions, namely, position X in the extending direction of the rail 1, position Y in the lateral direction, position Z in the vertical direction, and position or inclination $\Theta$ as rotation about the vertical axis. Here, subscripts attached to positions in each of the directions in the common coordinate ($X^{}$, $Y^{}$, $Z^{}$, $\Theta^{}$) will be explained. The first subscript on the left side indicates the type of the placement portion, e.g., including "1" for port of manufacturing equipment, "2" for UTB, "3" for right STB, and "4" for left STB. The second subscript on the right side indicates the identification number of the placement portion, including a number "1" or more attached to each of the placement portions 4. In contrast, subscripts attached to positions in each of the directions in the machine difference coordinate ($X^{*}$, $Y^{*}$, $Z^{*}$, $\Theta^{*}$) will be explained. The first subscript on the left side indicates the type of the placement portion, similar to that of the common coordinate. The second subscript in the middle indicates the identification number of the vehicle 2, including a number "1" or more attached to each of the vehicles 2. The third subscript on the right side indicates whether or not a FOUP 3 is present, including "1" for a case where the FOUP 3 is present, and "2" for a case where the FOUP 3 is not present. In this case, for example, the transfer position in the holding operation for the port A of the manufacturing equipment is sum of the common coordinate ($X_{1A}$, $Y_{1A}$, $Z_{1A}$, $\Theta_{1A}$) and the machine difference coordinate ($X_{111}$, $Y_{111}$, $Z_{111}$, $\Theta_{111}$). In addition, the transfer position in the placing operation is sum of the common coordinate ($X_{1A}$, $Y_{1A}$, $Z_{1A}$, $\Theta_{1A}$) and the machine difference coordinate ($X_{112}$, $Y_{112}$, $Z_{112}$, $\Theta_{112}$).

The offset amount a of the FOUP 3 in the holding operation and in the placing operation is shown as coordinates defined with the four directions. Here, in a coordinate ($\sigma_x^*$, $\sigma_y^*$, $\sigma_z^*$, $\sigma_\Theta^*$) indicating the offset amount $\sigma$, the subscripts attached to the positions in each of the directions include: the first subscript on the left side that indicates one direction among the four directions of X, Y, Z and $\Theta$, and the second subscript on the right side that indicates the type of placement portion including "1" for port of manufacturing equipment, "2" for UTB, "3" for right STB, "4" for left STB. In this case, for example, regarding the port A of the manufacturing equipment, the offset amount $\sigma$, which is the difference in transfer positions between the holding operation and the placing operation, is ($\sigma_{X1}$, $\sigma_{Y1}$, $\sigma_{Z1}$, $\sigma_{\Theta 1}$).

Figure 8A:
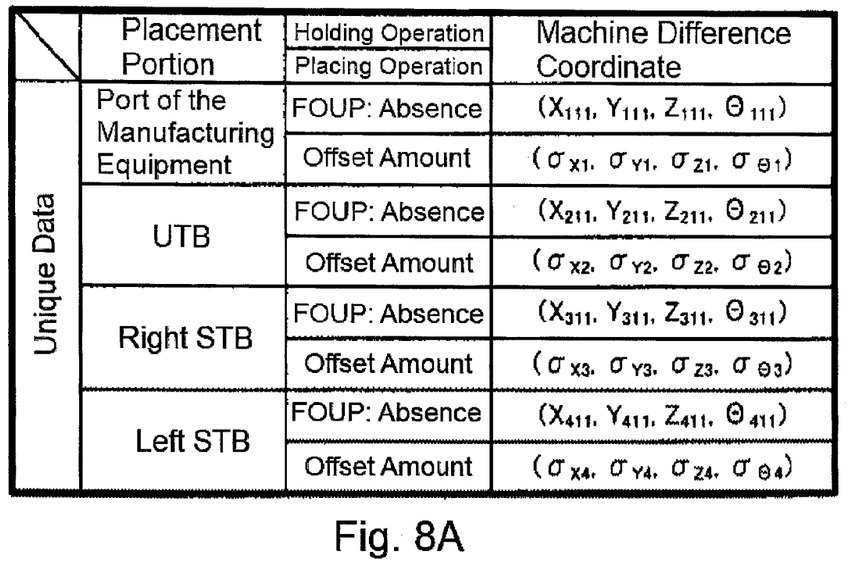
FIG. 8A is a table indicating another example of the unique data according to the present invention.

It should be noticed that, the unique data, as shown in FIG. 7, is not limited to those that indicate machine difference coordinates corresponding to the presence of the FOUP 3. For example, as shown in FIG. 8A, regarding the unique data, in the holding operation (in other words, when the FOUP is not present), the difference between the vehicle and a reference vehicle may be indicated as the machine difference coordinate ($X_{111}$, $Y_{111}$, $Z_{111}$, $\Theta_{111}$), and in the placing operation (in other words, when the FOUP is present), the offset from the machine difference coordinate when the FOUP is not present may be indicated as the machine difference coordinate ($\sigma_{X1}$, $\sigma_{Y1}$, $\sigma_{Z1}$, $\sigma_{\Theta 1}$). In this case, for example, regarding the port A of the manufacturing equipment, the transfer position in the holding operation is indicated as sum of the common coordinate ($X_{1A}$, $Y_{1A}$, $Z_{1A}$, $\Theta_{1A}$) and the machine difference coordinate ($X_{111}$, $Y_{111}$, $Z_{111}$, $\Theta_{111}$). In addition, the transfer position in the placing operation is indicated as sum of the common coordinate ($X_{1A}$, $Y_{1A}$, $Z_{1A}$, $\Theta_{1A}$) and the machine difference coordinate ($X_{111}$, $Y_{111}$, $Z_{111}$, $\Theta_{111}$) in the holding operation, plus the machine difference coordinate ($\sigma_{X1}$, $\sigma_{Y1}$, $\sigma_{Z1}$, $\sigma_{\Theta1}$) corresponding to the offset amount $\sigma$.

Figure 8B:
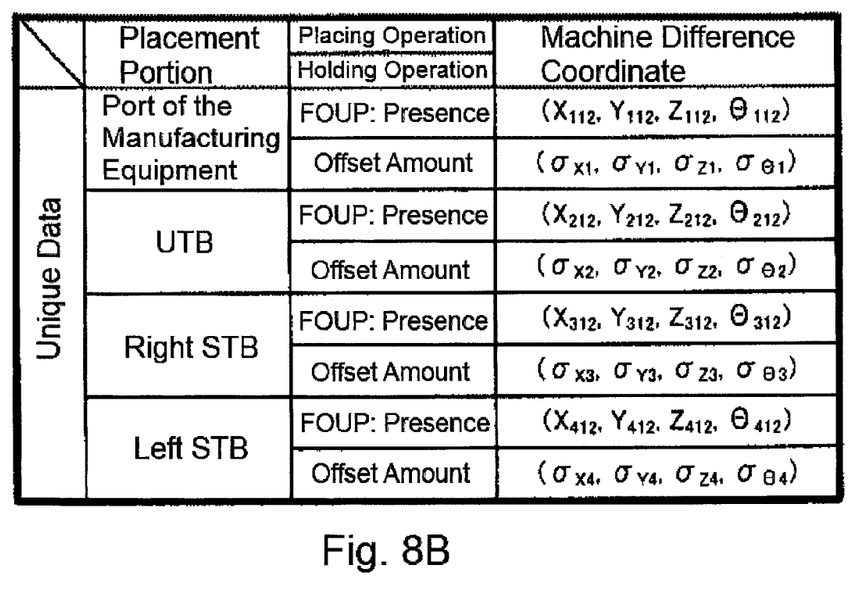
FIG. 8B is a table indicating another example of the unique data according to the present invention.

In contrast, for example, as shown in FIG. 8B, regarding the unique data, in the placing operation (in other words, when the FOUP is present), the difference between the vehicle and a reference vehicle may be indicated as the machine difference coordinate ($X_{112}$, $Y_{112}$, $Z_{112}$, $\Theta_{112}$), and in the holding operation (in other words, when the FOUP is not present), offset/distance/difference from the machine difference coordinate when the FOUP is present may be indicated as the machine difference coordinate ($\sigma_{X1}$, $\sigma_{Y1}$, $\sigma_{Z1}$, $\sigma_{\Theta1}$). In this case, for example, regarding the port A of the manufacturing equipment, the transfer position in the placing operation is indicated as sum of the common coordinate ($X_{1A}$, $Y_{1A}$, $Z_{1A}$, $\Theta_{1A}$) and the machine difference coordinate ($X_{112}$, $Y_{112}$, $Z_{112}$, $\Theta_{112}$). In addition, the transfer position in the holding operation may be indicated as sum of the common coordinate ($X_{1A}$, $Y_{1A}$, $Z_{1A}$, $\Theta_{1A}$) and the machine difference coordinate ($X_{112}$, $Y_{112}$, $Z_{112}$, $\Theta_{112}$) in the placing operation, minus the machine difference coordinate ($\sigma_{X1}$, $\sigma_{Y1}$, $\sigma_{Z1}$, $\Theta_{\Theta1}$) corresponding to the offset amount $\sigma$.

Figure 9:
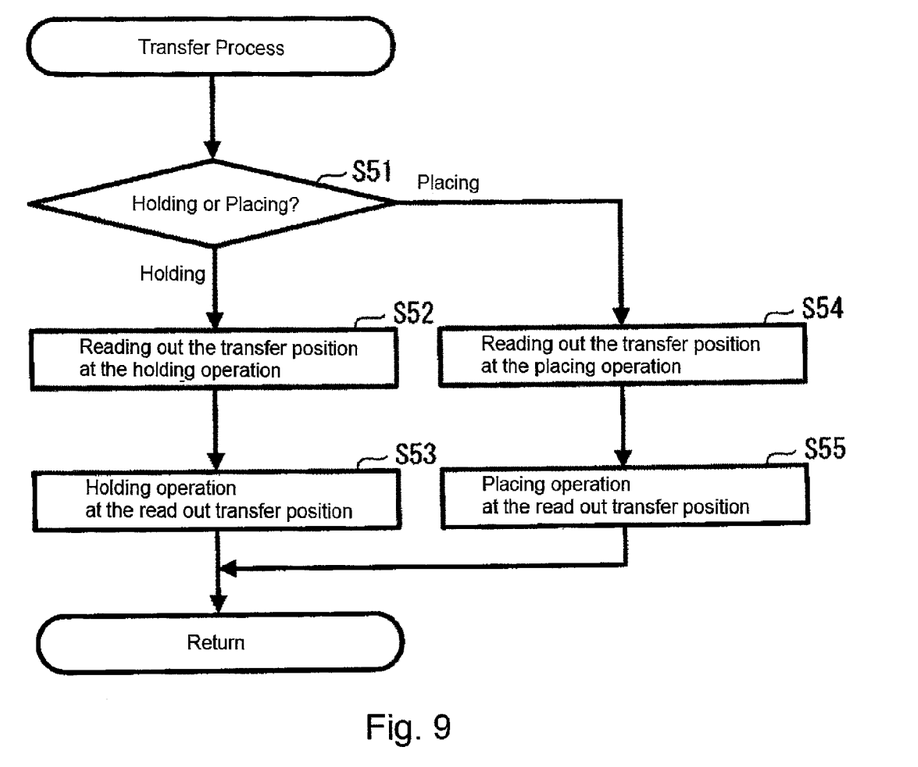
FIG. 9 is a flowchart for explaining about a transfer process in a lateral transfer manner according to the embodiments.

Next, with reference to FIG. 9, the operations of the transfer system 100 according to the present embodiment of the present invention will be explained. FIG. 9 is a flowchart showing transfer process in the transfer system 100. It should be noticed that all of the vehicles 2 in the transfer system 100 teach the common data to each other via the transmitting and receiving unit 103 and always keep the latest common data in this embodiment.

In FIG. 9, first of all, the vehicle controller 102 determines, based on the instruction signals sent from the transport instruction unit 201, whether the operation to be performed is a holding operation or a placing operation (Step S51). As a result, if the operation is the holding operation (Step S51: Holding), the vehicle controller 102 reads out from the memory 101 common data and unique data related to one of the placement portions 4 that serves as a destination of transfer. Then the vehicle controller 102 calculates, based on the read out data, transfer position in the holding operation (Step S52). Then the holding operation is performed at the calculated transfer position (Step S53). After that, the series of transfer processes is finished.

In contrast, if the outcome of the determination at Step S51 is a placing operation (Step S51: Placement), the vehicle controller 102 reads out from the memory 101 common data and unique data related to one of the placement portions 4 that serves as a destination of transfer, and calculates transfer position in the placing operation based on the read out data (Step S54). Then, the placing operation is performed at the calculated transfer position (Step S55). Accordingly, the series of transfer processes is finished.

According to a transfer process of the present embodiment, when performing the holding operation, the holding operation is performed at the transfer position corresponding to the holding operation, and the placing operation is performed at the transfer position corresponding to the placing operation. In other words, in the placing operation, the transfer position employed is different from that in the holding operation in order to address the offset of the FOUP 3 which may occur during the vertical transfer or the lateral transfer. Accordingly, it is possible to more positively transfer the FOUP 3 to the positioning location of the placement portion 4.

Furthermore, transfer positions in the holding operation and the placing operation are configured by two data, i.e., the common data and the unique data. This configuration makes it possible for the common data, which is common among all of the vehicles 2, to be taught among all of the vehicles 2 in the transfer system 100 and to be always renewed. Accordingly, it is possible to always maintain highly precise transfer position information in the vehicles 2. As a result, it is possible to save the time for obtaining the latest common data prior to the transfer operation, thereby minimizing the transfer time.

The present invention is not limited to the above-described embodiment. It is possible to change the embodiment within gist or concept of the invention understood based on the claims and the entire specification. A transfer system changed as such would be included in the technical scope of the present invention.

EXPLANATION OF REFERENCE 1 rail
2 vehicle
3 FOUP
4 placement portion
100 transfer system
101 memory
102 vehicle controller
103 transmitting and receiving unit

The invention claimed is:

1. A transfer system comprising:
a transport vehicle configured to move along a rail provided on a ceiling for moving an article; and
a placement portion disposed below the rail, having a predetermined position on which the article can be placed; wherein
the transport vehicle has a transfer unit configured to hold the article on the placement portion and to place the article onto the placement portion,
the transfer unit is configured to transfer the article between the transport vehicle and the placement portion,
the transfer system further comprising:
a memory configured to store (i) placement position information indicating a transfer position of the article when the transfer unit is to place the article onto the placement portion, and (ii) holding position information indicating a transfer position of the article when the transfer unit is to hold the article on the placement portion, the placement position information and the holding position information being independent information from each other; and
a controller configured to control the transfer unit such that, when the transfer unit is to place the article, the article is transferred at a transfer position indicated in the placement position information in the memory and, when the transfer unit is to hold the article, the article is transferred at a transfer position indicated in the holding position information in the memory;
the transfer unit includes:
a holding unit configured to hold and release the article;
a vertical moving unit configured to move the holding unit in a vertical direction;
a lateral moving unit configured to move the holding unit in a lateral direction perpendicular to the direction of the rail; and
the transport vehicle being configured to move the article in a lateral direction and transfer the article between the transport vehicle and the placement portion, which is arranged in a lateral direction of a main body of the transport vehicle.

2. The transfer system according to claim 1, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

3. The transfer system according to claim 1, wherein the transfer unit includes:

a rotation moving unit configured to rotate the holding unit around a vertical axis; wherein each of the placement position information and the holding position information indicates positions in four directions including the direction of the rail, the lateral direction, the vertical direction, and the rotation direction around the vertical axis.

4. The transfer system according to claim 3, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

5. The transfer system according to claim 1, wherein the placement position information and the holding position information are each indicated as sum of a common data indicating a transfer position common among a plurality of transport vehicles and a unique data indicating a transfer position unique to each transport vehicle.

6. The transfer system according to claim 5, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

7. The transfer system according to claim 5, further comprising a teaching unit configured to teach the common data among a plurality of transport vehicles.

8. The transfer system according to claim 7, wherein the difference between the unique data of the placement position information and the unique data of the holding position information corresponds to an offset amount of the article calculated based on inclination degree of the article and a height of the article at the transfer position.

9. The transfer system according to claim 8, wherein
each of the placement position information and the holding position information indicates positions in four directions including the direction of the rail, the lateral direction, the vertical direction, and the rotation direction around the vertical axis.

10. The transfer system according to claim 5, wherein the transfer unit includes:

a rotation moving unit configured to rotate the holding unit around a vertical axis; wherein each of the placement position information and the holding position information indicates positions in four directions including the direction of the rail, the lateral direction, the vertical direction, and the rotation direction around the vertical axis.

11. The transfer system according to claim 10, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

12. The transfer system according to claim 10, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

13. The transfer system according to claim 12, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

14. The transfer system according to claim 5, wherein the difference between the unique data of the placement position information and the unique data of the holding position information corresponds to an offset amount of the article calculated based on inclination degree of the article and a height of the article at the transfer position.

15. The transfer system according to claim 14, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

16. The transfer system according to claim 14, wherein the transfer unit includes:

a rotation moving unit configured to rotate the holding unit around a vertical axis; wherein each of the placement position information and the holding position information indicates positions in four directions including the direction of the rail, the lateral direction, the vertical direction, and the rotation direction around the vertical axis.

17. The transfer system according to claim 16, wherein the article includes a bottom surface formed with a concave portion, the placement portion includes a top surface formed with a convex portion that can be engaged with the concave portion, the article is placed on the predetermined position, where the article is positioned relative to the placement portion, by engagement between the concave portion and the convex portion.

* * * * *